(12) United States Patent
Rosenzweig et al.

(10) Patent No.: US 8,481,228 B2
(45) Date of Patent: Jul. 9, 2013

(54) FUEL CELL ASSEMBLY

(75) Inventors: Alain Rosenzweig, St. Maur des Fosses (FR); Kurt Rath, Herblay (FR); Jean Yves Laurent, Domene (FR); Bruno Vallon, Grenoble (FR); Andrew J. Curello, Hamden, CT (US)

(73) Assignee: Societe Bic, Clichy Cedex (FR)

( * ) Notice: Subject to any disclaimer, the term of this patent is extended or adjusted under 35 U.S.C. 154(b) by 602 days.

(21) Appl. No.: 12/307,962

(22) PCT Filed: Jul. 10, 2007

(86) PCT No.: PCT/US2007/015292
§ 371 (c)(1),
(2), (4) Date: Jan. 8, 2009

(87) PCT Pub. No.: WO2008/008228
PCT Pub. Date: Jan. 17, 2008

(65) Prior Publication Data
US 2009/0311561 A1    Dec. 17, 2009

Related U.S. Application Data

(60) Provisional application No. 60/807,016, filed on Jul. 11, 2006.

(51) Int. Cl.
*H01M 2/08* (2006.01)

(52) U.S. Cl.
USPC ........................................... 429/507

(58) Field of Classification Search
USPC ............... 429/507, 400, 457, 465, 483, 516, 429/515, 534
See application file for complete search history.

(56) References Cited

U.S. PATENT DOCUMENTS

| 4,089,636 A | * | 5/1978 | Goto ........................ 431/132 |
| 5,190,834 A | | 3/1993 | Kendall |
| 5,629,104 A | | 5/1997 | Crawford, Sr. et al. |

(Continued)

FOREIGN PATENT DOCUMENTS

JP    H04-233167 A    8/1992

OTHER PUBLICATIONS

International Search Report and Written Opinion issued in connection with international application No. PCT/US2007/015292 on Jul. 30, 2008.

(Continued)

*Primary Examiner* — Jean F Duverne
(74) *Attorney, Agent, or Firm* — The H.T. Than Law Group

(57) ABSTRACT

Disclosed herein is a fuel cell assembly that arranges a plurality of individual fuel cells into an array. The fuel cells are set into openings formed in a frame. The openings are arranged into the array, such as in columns and rows. A rear cover is sealingly attached to the frame, thereby defining a chamber between the frame and a base of the rear cover, where the chamber serves as a manifold. Optional supports extend from the base to the fuel cells. The void forms a fluid manifold for dispersing fuel for the fuel cells from a fuel reservoir to the fuel cells. Alternatively, the rear cover separates the interstitial space between the rear cover and the frame into compartments, which are fluidly interconnected by channels. The array may also include a functional element electrically connected to the fuel cells configured to transfer power an electronic device.

29 Claims, 12 Drawing Sheets

U.S. PATENT DOCUMENTS

| | | | |
|---|---|---|---|
| 5,783,324 A | 7/1998 | Binder et al. | |
| 5,861,221 A | 1/1999 | Ledjeff et al. | |
| 5,863,672 A | 1/1999 | Ledjeff et al. | |
| 5,989,741 A | 11/1999 | Bloomfield et al. | |
| 6,007,932 A | 12/1999 | Steyn | |
| 6,127,058 A | 10/2000 | Pratt et al. | |
| 6,482,541 B1 | 11/2002 | Bator, Jr. et al. | |
| 6,492,053 B1* | 12/2002 | Donelson et al. | 429/458 |
| 8,039,168 B2* | 10/2011 | Serizawa et al. | 429/507 |
| 2003/0022040 A1* | 1/2003 | Wells | 429/23 |
| 2003/0059660 A1* | 3/2003 | Kamo et al. | 429/32 |
| 2004/0071865 A1 | 4/2004 | Mosdale et al. | |
| 2004/0209136 A1 | 10/2004 | Ren et al. | |
| 2005/0074651 A1 | 4/2005 | Kidai et al. | |
| 2005/0084736 A1 | 4/2005 | Chang et al. | |
| 2005/0196666 A1* | 9/2005 | Gottesfeld et al. | 429/127 |
| 2005/0214621 A1 | 9/2005 | Liu et al. | |
| 2005/0255349 A1 | 11/2005 | Fisher et al. | |
| 2006/0008693 A1 | 1/2006 | Kamo et al. | |
| 2006/0115703 A1* | 6/2006 | Kubota et al. | 429/35 |
| 2007/0190379 A1* | 8/2007 | Song et al. | 429/24 |
| 2009/0095409 A1 | 4/2009 | Schrooten et al. | |
| 2009/0155663 A1* | 6/2009 | Serizawa et al. | 429/34 |
| 2009/0162722 A1 | 6/2009 | Schrooten et al. | |
| 2009/0311561 A1* | 12/2009 | Rosenzweig et al. | 429/13 |
| 2010/0141202 A1* | 6/2010 | Spies et al. | 320/101 |

OTHER PUBLICATIONS

Extended European Search Report issued in connection with the corresponding European Patent Application No. 07810119.3 on Dec. 12, 2011.

Translated Abstract of JP H04-233167 to Motohiro et al., Aug. 21, 1992.

* cited by examiner

FUEL CELL ASSEMBLY

BACKGROUND OF THE INVENTION

This invention generally relates to improved fuel cell systems, and more particularly to fuel cell assemblies containing substantially planar arrays of fuel cells or membrane electrode assemblies (MEA's) with a relatively uniform anode-side hydrogen gas supply.

Fuel cells are devices that directly convert chemical energy of reactants, i.e., fuel and oxidant, into direct current (DC) electricity. For an increasing number of applications, fuel cells are more efficient than conventional power generation, such as combustion of fossil fuel, as well as portable power storage, such as lithium-ion batteries.

In general, fuel cell technology includes a variety of different fuel cells, such as alkali fuel cells, polymer electrolyte fuel cells, phosphoric acid fuel cells, molten carbonate fuel cells, solid oxide fuel cells, and enzyme fuel cells. Today's more important fuel cells can be divided into several general categories, namely (i) fuel cells utilizing compressed hydrogen ($H_2$) as fuel; (ii) proton exchange membrane (PEM) fuel cells that use alcohols, e.g., methanol ($CH_3OH$), metal hydrides, e.g., sodium borohydride ($NaBH_4$), hydrocarbons, or other fuels reformed into hydrogen fuel; (iii) PEM fuel cells that can consume non-hydrogen fuel directly or direct oxidation fuel cells; and (iv) solid oxide fuel cells (SOFC) that directly convert hydrocarbon fuels to electricity at high temperatures.

Compressed hydrogen is generally kept under high pressure and is therefore difficult to handle. Furthermore, large storage tanks are typically required and cannot be made sufficiently small for consumer electronic devices. Conventional reformat fuel cells require reformers and other vaporization and auxiliary systems to convert fuels to hydrogen to react with oxidant in the fuel cell. Recent advances make reformer or reformat fuel cells promising for consumer electronic devices. The most common direct oxidation fuel cells are direct methanol fuel cells, or DMFC. Other direct oxidation fuel cells include direct tetramethyl orthocarbonate fuel cells. DMFC, where methanol is reacted directly with oxidant in the fuel cell, is the simplest and potentially smallest fuel cell, and also has promising power application for consumer electronic devices. SOFC converts hydrocarbon fuels, such as butane, at high heat to produce electricity. SOFC requires relatively high temperatures in the range of 1000° C. for the fuel cell reaction to occur.

The chemical reactions that produce electricity are different for each type of fuel cell. For DMFC, the chemical-electrical reaction at each electrode and the overall reaction for a direct methanol fuel cell are described as follows:

Half-reaction at the anode:

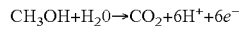

Half-reaction at the cathode:

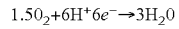

The overall fuel cell reaction:

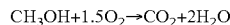

The overall fuel cell reaction:

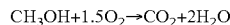

Due to the migration of the hydrogen ions (H+) through the PEM from the anode to the cathode, and due to the inability of the free electrons (e−) to pass through the PEM, the electrons flow through an external circuit, thereby producing an electrical current through the external circuit. The external circuit may be used to power many useful consumer electronic devices, such as mobile or cell phones, portable music players, calculators, personal digital assistants, laptop computers, and power tools, among others.

DMFC is discussed in U.S. Pat. Nos. 4,390,603 and 4,828,941, which are incorporated by reference herein in their entireties. Generally, the PEM is made from a polymer, such as Nafion® available from DuPont, which is a perfluorinated sulfonic acid polymer having a thickness in the range of about 0.05 mm to about 0.50 mm, or other suitable membranes. The anode is typically made from a Teflonized carbon paper support with a thin layer of catalyst, such as platinum-ruthenium, deposited thereon. The cathode is typically a gas diffusion electrode in which platinum particles are bonded to one side of the membrane.

In a chemical metal hydride fuel cell, sodium borohydride is reformed and reacts as follows:

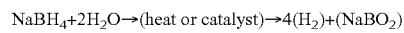

Half-reaction at the anode:

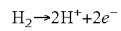

Half-reaction at the cathode:

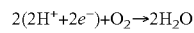

Suitable catalysts for this reaction include platinum and ruthenium, among other metals. The hydrogen fuel produced from reforming sodium borohydride is reacted in the fuel cell with an oxidant, such as $O_2$, to create electricity (or a flow of electrons) and water byproduct. Sodium borate ($NaBO_2$) byproduct is also produced by the reforming process. A sodium borohydride fuel cell is discussed in U.S. Pat. No. 4,261,956, which is incorporated by reference herein in its entirety.

Fuel cell systems traditionally have multiple fuel cells arrayed in stacks. These stacks tend to be relatively inefficient, as it is difficult for the fuel to flow uniformly to the anode sides of fuel cells.

The patent literature discloses attempts to improve fuel flow in the stack. In one example, U.S. Pat. No. 6,887,611 B2 discloses a flexible external fuel cell gas manifold designed to accommodate bowing and shrinkage of the stack while maintaining a gas seal, and reducing dielectric insulator breakage.

U.S. Patent Application Publication No. 2005/0196666 A1 discloses fuel cells that are assembled into substantially planar arrangements. These substantially planar fuel cell arrays can be contour-molded to a desired shape or can be constructed as a pliable fuel cell or as an array of flexibly connected individual fuel cells that overall has a curvilinear shape. However, this publication does not disclose a way to distribute fuel to the fuel cells, but discusses a fuel gel that vaporizes through a fuel permeable layer.

U.S. Patent Publication No. 2005/0255349 A1 also discloses a substantially planar fuel cell array. This reference discloses a hydrogen manifold having two narrow hydrogen channels and two hydrogen ports.

Hence, there remains a need for improved gas manifolds to deliver fuel to the fuel cell.

SUMMARY OF THE INVENTION

The present invention is directed generally toward improved fuel cell systems, and more particularly to fuel cell assemblies containing substantially planar arrays of fuel cells or membrane electrode assemblies with a relatively uniform anode-side hydrogen gas supply.

In one embodiment, the present invention is directed toward a fuel cell assembly that includes a frame with plurality of openings, fuel cells disposed in the openings, and a rear cover with at least one fuel inlet that attaches to the frame so as to form a fuel chamber between the frame and the rear cover. The chamber formed may be open to allow the fuel to come in contact with all fuel cells freely, or it may have channels disposed therein to regulate the flow of fuel. An outlet may also be provided in the rear cover to allow unreacted fuel or waste to escape. The fuel cells are preferably electrically connected to each other in series or parallel. The frame and cover may be made of flexible materials or utilize an attachment to allow the fuel cells to be configured in multiple planes.

In another embodiment, the present invention is directed toward a power module that includes at least one fuel cell electrically connected to a functional element, where the functional element is capable of transferring electricity from the fuel cell(s) to an electronic device. The functional element is preferably an Application Specific Integrated Circuit (ASIC) chip. The power module may utilize the fuel cell assembly described herein or any other known fuel cell assemblies.

In yet another embodiment, the present invention relates to a method of providing electricity to an electronic device. This method includes transferring fuel from a fuel supply to fuel cell that is electrically connected to a functional element, transforming the electric current using the functional element into usable current, and transferring the usable current to an electronic device.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE PREFERRED EMBODIMENTS

Figure 1:
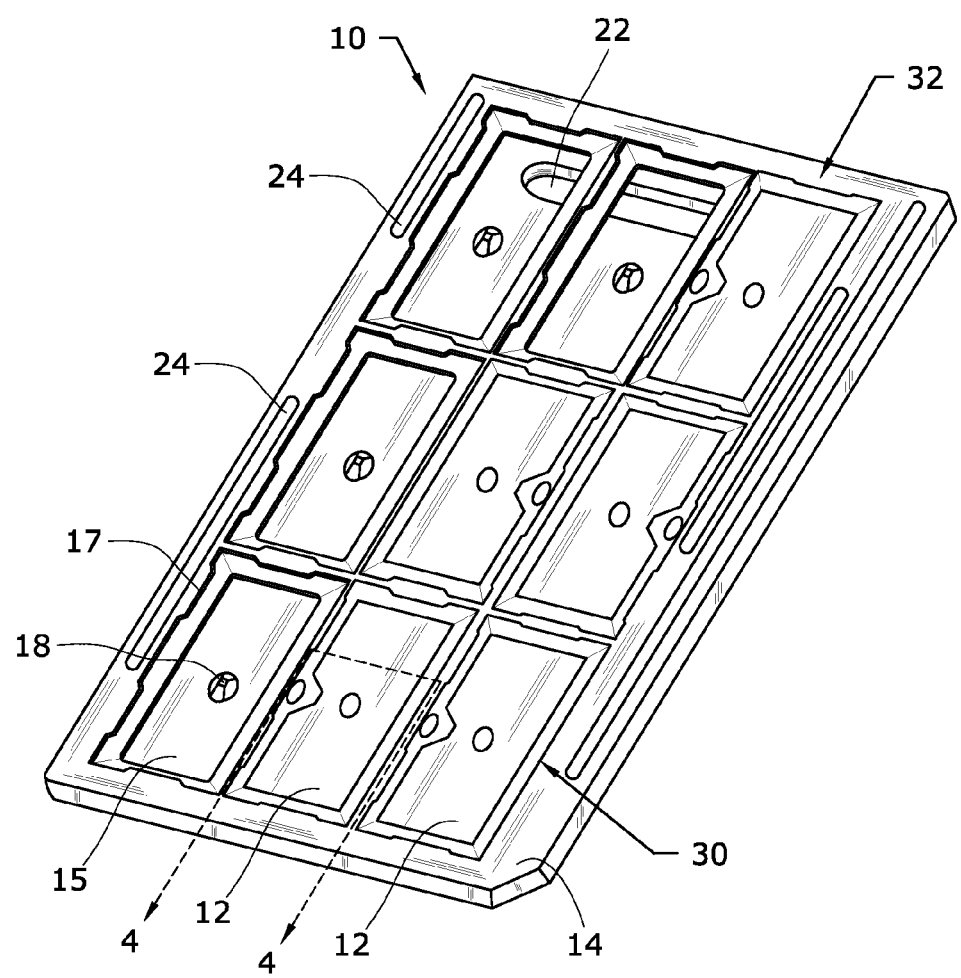
FIG. 1 is a perspective partial view of a fuel cell assembly according to the present invention with several of the fuel cells omitted for clarity.

As illustrated in the accompanying drawings and discussed in detail below, the present invention is directed to an assembly 10 for a plurality of fuel cells 12, as shown in FIG. 1. Fuel cell 12 may be any type of fuel cell known in the art including a cathode, an anode, and a proton exchange membrane (PEM). Assembly 10 provides a frame 14 into which individual fuel cells 12 are arranged into a planar array. Assembly 10 may contain any number of individual fuel cells 12 desired by sealingly inserting fuel cells 12 into openings 15 formed in frame 14 shown in FIG. 2. Fuel cells 12 are arranged within assembly 10 so that each fuel cell 12 has access to a fuel source, preferably hydrogen, and also so that any byproducts of the reaction, e.g., water vapor, are contained or transported away for disposal. Frame 14 may comprise an antibacterial or antimicrobial agent to combat any bacterial growth that might otherwise occur in an enclosed environment such as fuel cell assembly 10. As shown in FIG. 3, the assembly 10 may also include heat sinks 23 to aid in thermal conductivity and dissipation of heat throughout assembly 10. Heat sinks 23 may be made of any suitable material known in the art, and may also be of any shape known in the art, including but not limited to a fin. Additionally, assembly 10 provides serial electrical connections to connect fuel cells 12 together regardless of the arrangement of fuel cells 12 within assembly 10.

Figure 4:
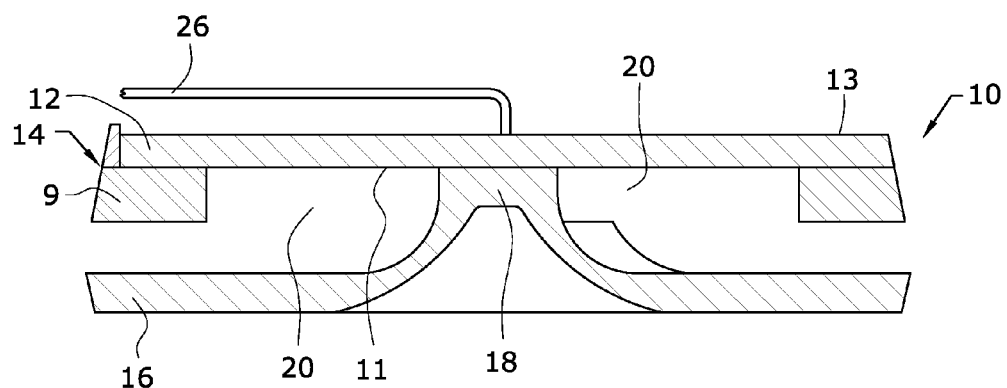
FIG. 4 is an enlarged cross-sectional view of the fuel cell assembly of FIG. 3 taken along line 4-4 thereof.

Referring again to FIGS. 1 and 2, frame 14 provides the support structure for assembly 10, forming the overall outline of assembly 10 and having formed within the outline several openings 15 configured to receive therewithin fuel cells 12. Openings 15 are preferably arranged into rows 30 and columns 32. Openings 15 are sized and dimensioned to receive fuel cells 12 so that fuel cells 12 may be sealed within opening 15 around a periphery of fuel cells 12, which may be any shape known in the art. As shown in FIG. 4, discussed in greater detail below, sidewalls 9 formed by opening 15 within frame 14 are preferably at least co-extensive with the thickness of fuel cell 12 and support fuel cell 12. Rear cover 16 has a plurality of supports 18, upstanding therefrom. Each support 18 supports a fuel cell 12 proximate to the geometric center of fuel cell 12. As will be recognized by those in the art, while nine openings 15 are shown in the drawings, any number of openings 15 and/or fuel cells 12 may be included within frame 14. Opening 15 may also include one or more retaining mechanisms to prevent fuel cell 12 from slipping out of the front of frame 14. Preferably, epoxy or other adhesives are used to secure fuel cell 12 within opening 15. Additional mechanisms for retaining fuel cell 12 within opening 15 may also be used. For example, as shown in FIG. 1, opening 15 includes optional tabs 17 to extend over fuel cell 12 to retain fuel cell 12 within opening 15.

Figure 2:
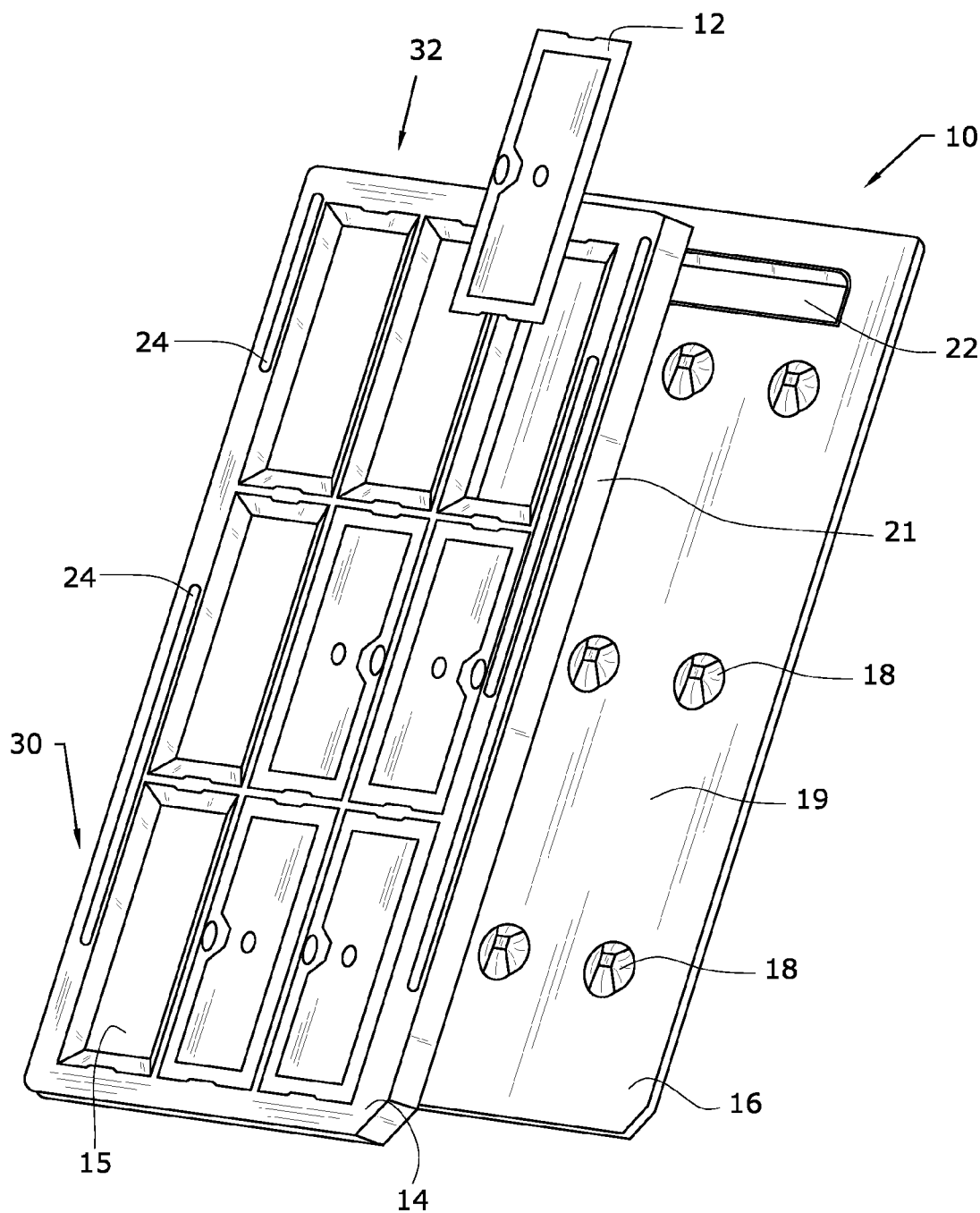
FIG. 2 is an exploded view of the fuel cell assembly of FIG. 1.
Figure 3:
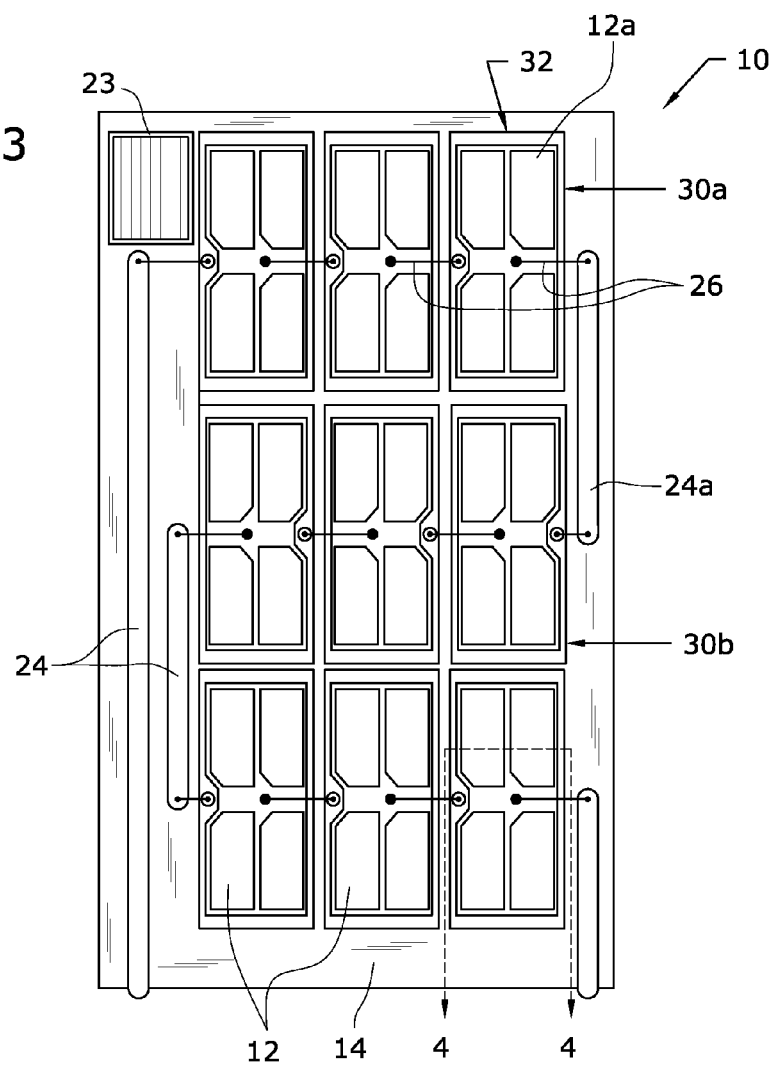
FIG. 3 is a top elevated plan view of the complete fuel cell assembly of FIG. 1 showing the electrical connections.

Frame 14 may have skirt or sidewall 21 dependent therefrom, and sealingly attached to frame 14 is a rear cover 16, shown in FIG. 2. Rear cover 16 provides a backing for frame 14, which serves to both support fuel cells 12 in position within frame 14 and to provide a manifold for delivery of the fuel to fuel cells 12. As shown in FIG. 4, rear cover 16 is configured such that when attached to frame 14, a manifold space or chamber 20, shown in FIG. 4, is formed between rear cover 16 and fuel cells 12. In other words, when rear cover 16 is attached to frame 14, a box-like structure is formed, with fuel cells 12 situated on the cover of the box so that the anode sides 11 of fuel cells 12 are "inside" the box while the cathode sides 13 of fuel cells 12 are "on top" of the box. As will be recognized by those in the art, assembly 10 may be used in any orientation. In another embodiment, frame 14 may be relatively shallow and rear cover 16 may include relatively high sidewalls 21 to form the box. Additionally, spacers, not shown, could be sealingly inserted between frame 14 and rear cover 16 to provide the separation to form chamber 20.

Rear cover 16 includes base 19, at least one support 18, and a fuel inlet 22. As seen best in FIG. 4, the sides of chamber 20 are defined by rear cover 16, sidewalls 21, frame 14, and anode side 11 of fuel cells 12. Fuel inlet 22 defined in rear cover 16 is fluidly connected to chamber 20, which in the embodiment shown in FIGS. 1-4 forms a continuous fluid distribution pathway or manifold behind frame 14. No significant structure other than supports 18 impedes the transfer of fuel from fuel inlet 22 to chamber 20 to come into contact with anode side 11 in each fuel cell 12 in assembly 10.

Figure 5:
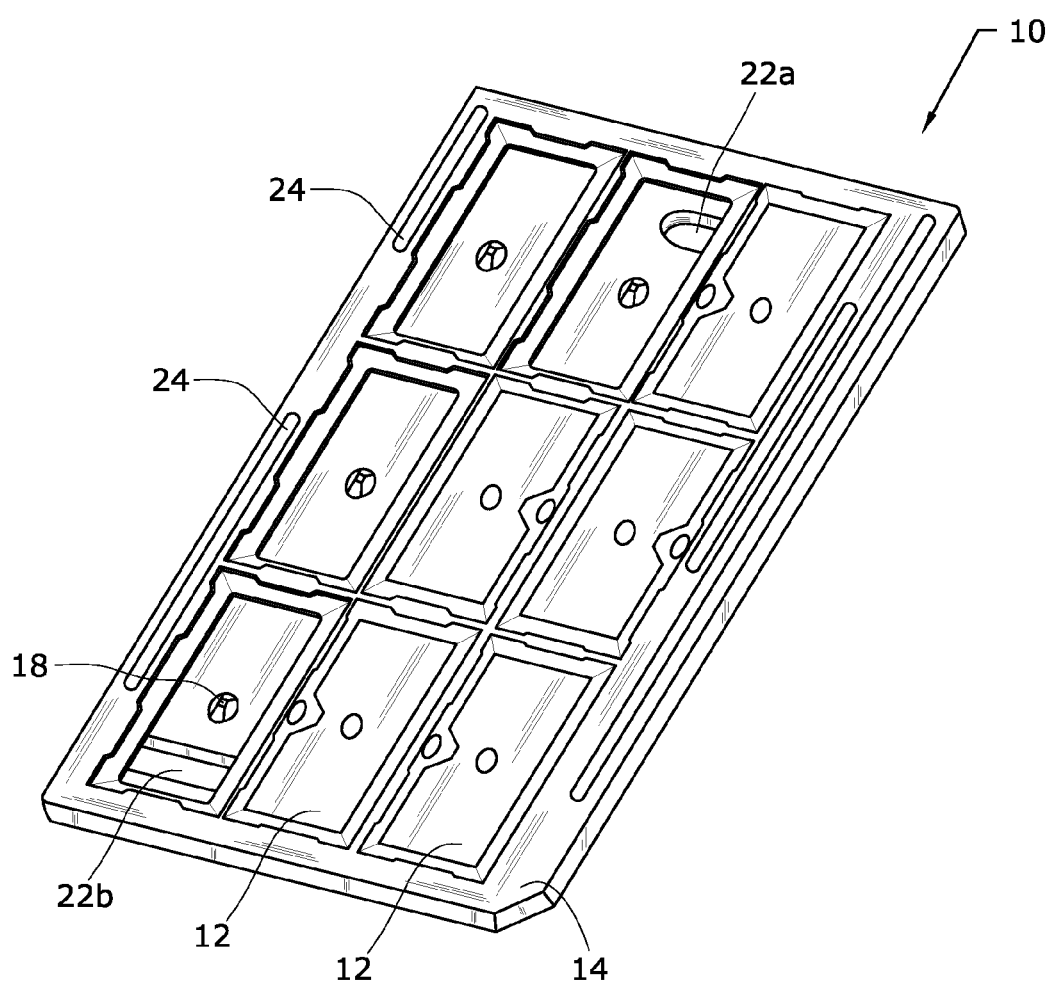
FIG. 5 is a perspective view of an alternate fuel cell assembly according to the present invention showing a different configuration for the hydrogen reservoir.

In the embodiment shown in FIGS. 1-4, the separation between rear cover 16 and fuel cell 12 is maintained in part by supports 18 and sidewalls 21. Fuel inlet 22 is a cavity formed from an opening in base 19 and extending outward from base 19 away from frame 14. Fuel inlet 22 may be co-formed unitary with base 19 or formed separately therefrom and sealingly attached thereto. For example, if base 19 and fuel inlet 22 are both made of moldable materials, base 19 and fuel inlet 22 could be formed separately and sealingly affixed together with an adhesive. Alternatively, base 19 may be molded with fuel inlet 22 as a portion of base 19. Fuel inlet 22 is configured to be attached to a fuel cartridge or fuel source to supply fuel to fuel cells 12. As shown in FIGS. 1 and 2, fuel inlet 22 is a single container formed at one end of rear cover 16. However, the present invention is not limited to such a configuration. Fuel inlet 22 may be a series of cavities positioned around rear cover 16 so that the fuel may be more quickly dispersed to all fuel cells 12 within chamber 20. For example, as shown in FIG. 5, fuel inlet 22 is divided into two cavities, first port 22a and second port 22b, positioned at opposite ends of assembly 10. In such a configuration, the fuel will tend to flow through chamber 20 in a circular flow pattern, which discourages stagnant zones from forming within chamber 20 so that the distribution of fuel through the manifold of chamber 20 is improved. As will be recognized by those in the art, any number of configurations is possible for fuel inlet 22.

When fuel undergoes a chemical reaction inside fuel cells 12, it is possible that some fuel may remain unreacted. As such, the embodiment shown in FIG. 5 may be constructed such that either port 22a or port 22b is a fuel outlet capable of transporting the unreacted fuel away from chamber 20, either to be recycled or to exit assembly 10 altogether.

Frame 14 is preferably made from a rigid material capable of providing structural support for fuel cell 12, although any material known in the art is appropriate for use as frame 14. Preferably, frame 14 is made from a non-conductive material so that the electrical current generated by fuel cells 12 can be collected and directed to a device. For example, frame 14 may be made from moldable materials such as resins, plastics, and polymers, ceramics, flexible materials such as rubber and silicone, and the like. As such, fuel cells 12 may be arranged into any configuration, while being electrically connected in series or parallel.

Rear cover 16 is preferably made from a rigid material so as to provide structural support for assembly 10. However, any material known in that art that is substantially inert to the type of fuel used with fuel cells 12 is appropriate for use as rear cover 16. For example, any of the materials listed above as appropriate for use in frame 14 are appropriate for use as rear cover 16. Additionally, if rear cover 16 or portions thereof are held separate from fuel cells 12, rear cover 16 may also be made from conductive materials such as metals.

Figure 5A:
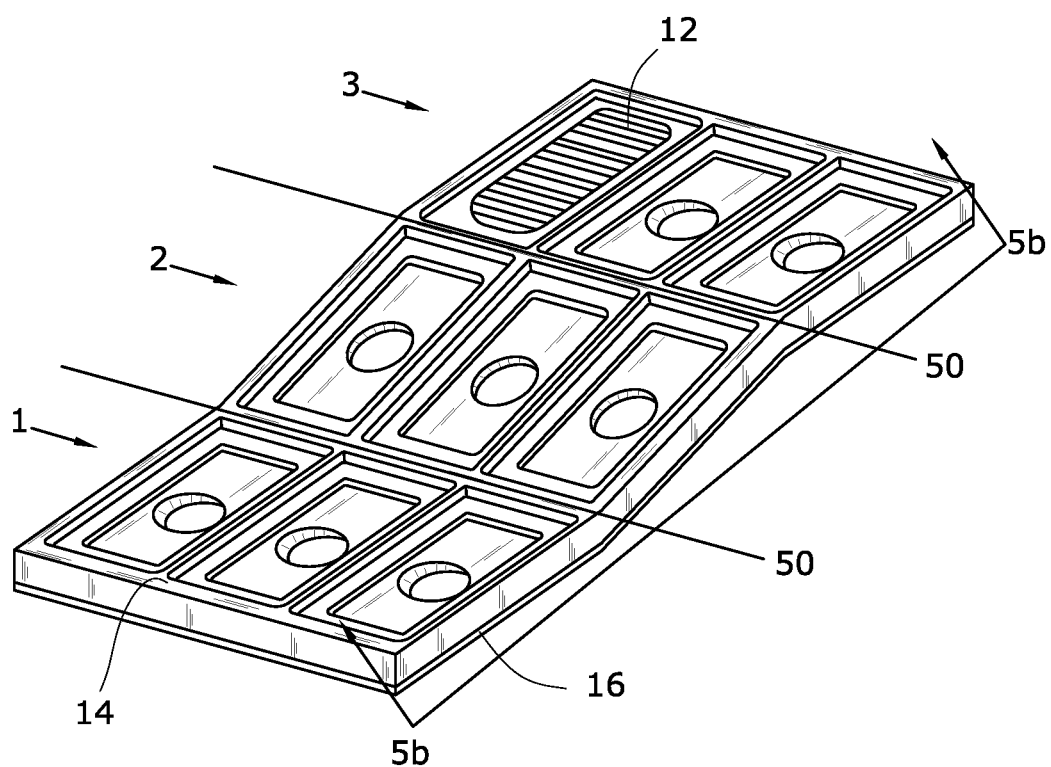
FIG. 5a is a perspective view of an alternate fuel cell assembly according to the present invention wherein the fuel cells are movable to a plurality of planes.
Figure 5B:
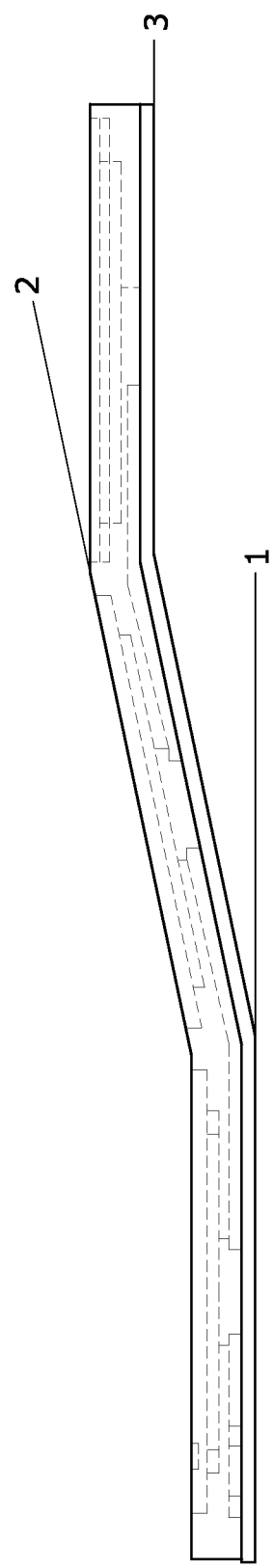
FIG. 5b is an enlarged cross-sectional view of the fuel cell assembly of FIG. 5a taken along line 5b-5b thereof.

As seen in FIGS. 5a and 5b, frame 14 and rear cover 16 may be configured or bent between rows 30 and/or columns 32 along an axis or axes 50 to allow rows 30 or columns 32 containing fuel cells 12 to be arranged in a plurality of planes. Fuel cells 12 may therefore be arranged in planes 1, 2, and 3 in FIG. 5a. The attachment between planes 1, 2, and 3 may be any type of flexible or jointed attachment known in the art, such as a hinge, a live hinge, a thinned portion of material, or the like. Alternatively, either frame 14 or rear cover 16, or both, may be constructed from a flexible material such as rubber, silicone, thin plastic or metal, and the like such that assembly 10 may be arranged into a plurality of planes, as above. As will be recognized by those in the art, axes 50 may be disposed between rows 30, columns 32, any combination thereof. Additionally, any number of axes 50 may be included, from none to an entirely flexible frame 14, i.e., a frame capable of being rolled into a substantially cylindrical configuration. The ability to fold or manipulate rows 30 and/or columns 32 in a plurality of planes 1, 2, and 3 would be useful in allowing the assembly to fit into flexible items such as clothing or items where space is at a premium and designers want options in the arrangement of internal components.

Figure 10A:
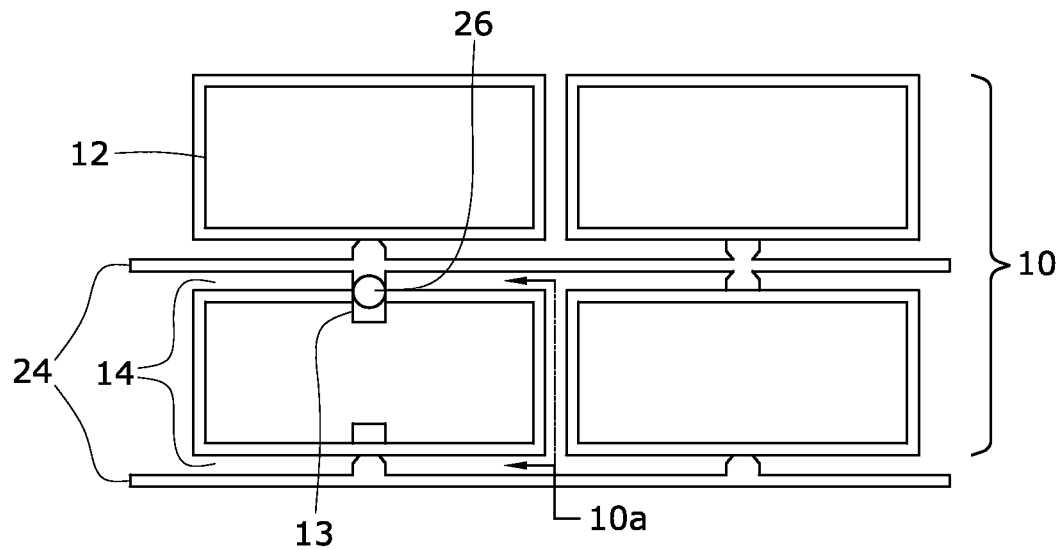
FIG. 10a is a top elevated plan view of a section of the fuel cell assembly of FIG. 1 showing alternate electrical connections.
Figure 10B:
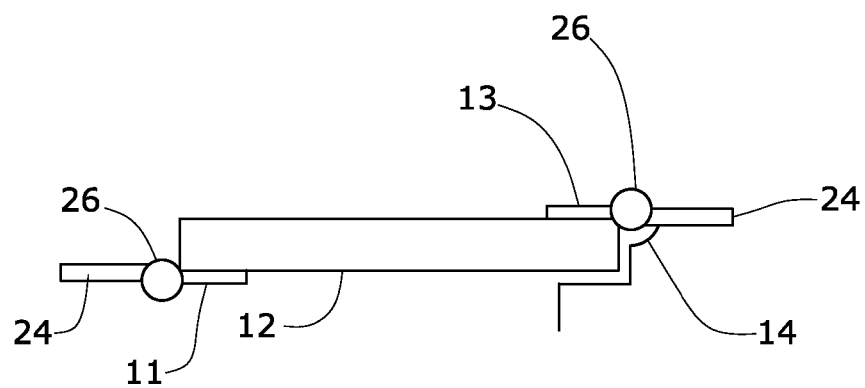
FIG. 10b is an enlarged cross-sectional view of the fuel cell assembly of FIG. 10 taken along line 10a-10a thereof.

The electrical currents generated by fuel cells are collected by electrical conductors and connectors. As shown in FIG. 3, electrical conductors 24 run along the sides on frame 14 on the top surfaces thereof. Conductors 24 may be any type of electrical conductor known in the art, such as metals including copper and gold, and may have any configuration known in the art, such as flat strips set onto the surface of frame 14, wires or filaments embedded within frame 14, or the like. Conductors 24 are preferably arranged so that fuel cells 12 in each row of the array of openings 15 may be serially linked to each other using electrical connectors 26. Electrical connectors 26 are preferably metal wires electrically attached to cathode side 13 of one fuel cell 12 to the anode side 11 of an adjacent fuel cell 12, and may be made from similar materials as electrical conductors 24. Connectors 26 may also be embedded within frame 14, wire-bonds, spots of conductive glue, balls of low-melting metals, or comparable interconnect technologies, in order to minimize and simplify the electrical connections between fuel cells 12. As shown in FIGS. 10a-10b, conductors 24 are deployed between rows (or columns) of fuel cells 12 and can be embedded in frame 14, and connectors 26 are electrically conductive spots or balls connecting cathodes 13 and anodes 11 to conductors 24.

Figure 10C:
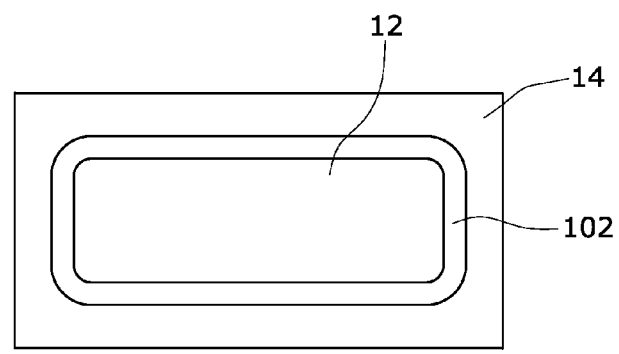
FIG. 10c is a top view of a single fuel cell being connected to the frame via conducting adhesive or weld.
Figure 10D:
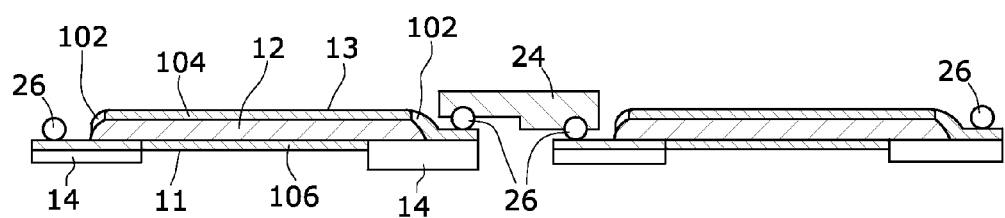
FIG. 10d is a cross-sectional view showing fuel cells being electrically connected together without wires.

Alternatively, fuel cell 12 can be connected to frame 14 via adhesive or weld 102, as shown in FIGS. 10c-10d. Adhesive/weld 102 can be used to assure that hydrogen gas is sealed within chamber 20. Adhesive/weld 102 can also be used to conduct electricity generated by fuel cell 12 to connectors 26 and conductor 24. FIG. 10d illustrates another method of collecting electricity. Fuel cell 12 has current collector plate 104 connected to cathode 13 and current collector plate 106 connected to anode 11. Plates 104 and 106 are used to improve current collection in the fuel cell assembly. Adhesive/weld 102 connects connector plate 104 and cathode 13 to connectors 26, and conductors 24 are used to bridge the cathode side of one fuel cell to the anode side of the adjacent fuel cell, as shown. The embodiment shown in FIGS. 10c-10d utilizes no electrical wires, and reduces the ohmic losses generally associated with electrical wires.

As shown in FIG. 3, each fuel cell 12 in the planar array of openings 15 is attached by a single electrical connector 26 to its horizontal neighbor within a row. A single electrical connector 26 connects the end fuel cell 12a of row 30a to conductor 24. Conductor 24 electrically connects row 30a with row 30b. As such, a single, serial electrical pathway is provided for assembly 10. As will be recognized by those in the art, any electrical pathway desired may be provided for assembly 10, such as a parallel pathway or a combination of serial and parallel pathways, simply by arranging conductors 24 and connectors 26 to form the desired electrical pathways. At least one conductor 24 is configured to be connected to a device (not shown) that will use the current or an intermediate device that collects and stores or adapts the current for use.

Figure 6:
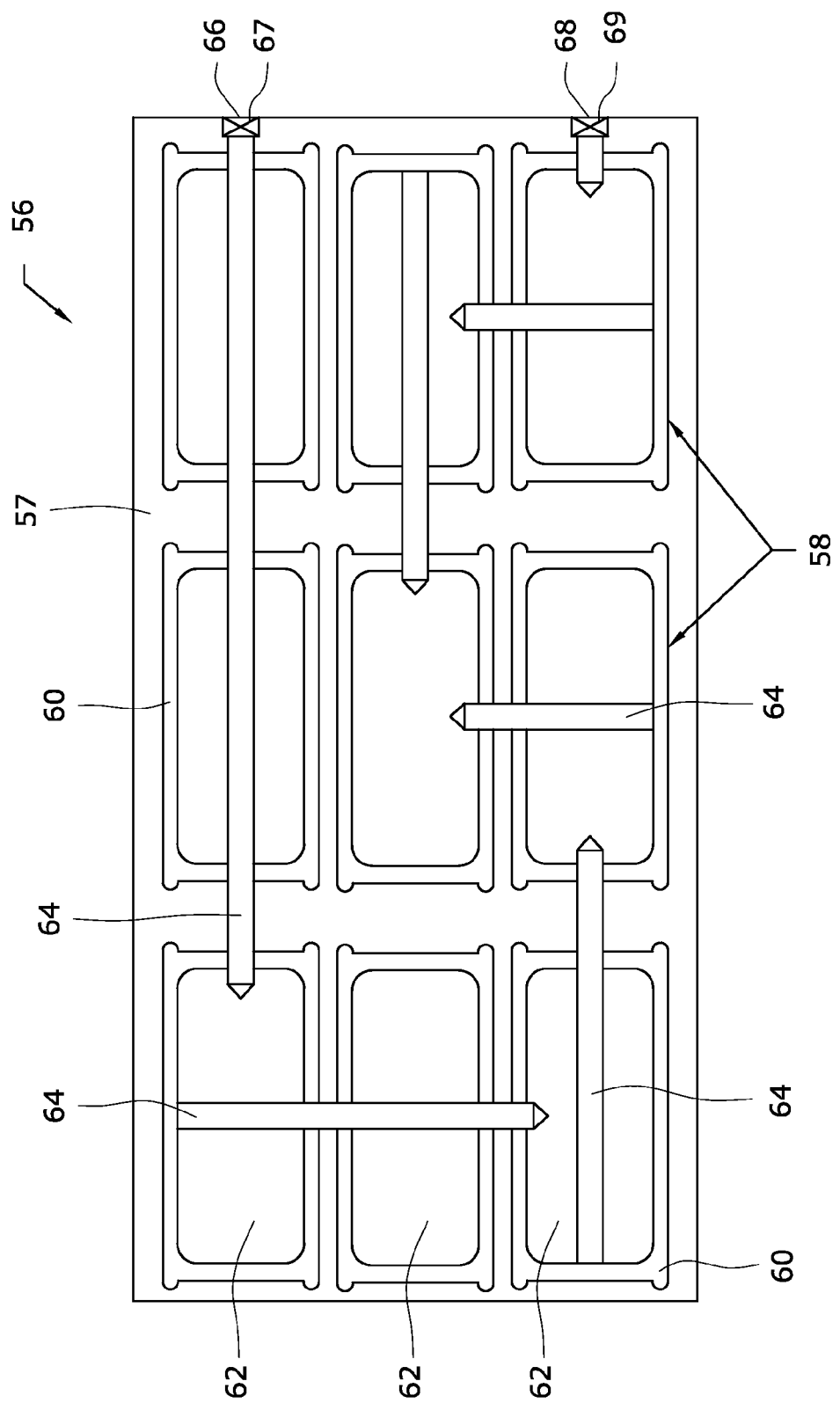
FIG. 6 is a top elevated plan view of an alternate rear cover for the fuel cell assembly of FIG. 1.

FIG. 6 shows an alternate rear cover 56 for use with assembly 10. Instead of forming a single chamber 20 when attached to frame 14, as in the embodiment shown and discussed above, rear cover 56 provides a single dedicated compartment 58 to correspond to each fuel cell 12 in the planar array defined by openings 15. Each compartment 58 includes sidewalls 60 extending away from a base 57 toward frame 14 (shown in FIGS. 1, 2), where sidewalls 60 form a shape similar to that of openings 15 and fuel cells 12 (shown in FIGS. 1, 2). Sidewalls 60 seal against frame 14 so that a void 62 is formed underneath each fuel cell 12, i.e., void 62 is defined by base 57, sidewalls 60 and anode side 11 (shown in FIG. 4) of fuel cell 12.

Compartments 58 are preferably fluidly interconnected by a series of channels 64 so that only one fuel supply, such as a fuel cartridge or external reservoir, can feed assembly 10. Channels 64 may be tubes that connect compartments 58 through sidewalls 60, channels formed in base 57, or any other type of fluid connector known in the art. Channels 64 may extend through multiple compartments 58 or join together only two compartments. The order of interconnection of channels 64 may be any order desired by the designer; for example, each compartment 58 may be connected to only one or two adjacent compartments 58, i.e., serial connection, or each compartment 58 may be connected to a plurality of other compartments 58, etc.

At least one channel 64 is preferably configured to be connected to an inlet 66 for fuel, and at least one channel 64 is preferably configured to be connected to an outlet 68. In another embodiment, outlet 68 may serve as an additional inlet. The fuel supply may be connected to inlet 66, for example with an inlet valve 67, and to outlet 68, for example with an outlet valve 69. Inlet valve 67 and outlet valve 69 are preferably check valves oriented oppositely to one another so that fuel may flow into an out of the fuel supply in only one flow path, regardless of the configuration of channels 64 within assembly 10. As will be recognized by those in the art, any valve known in the art is appropriate for use in the present invention, or no valve at all.

Figure 7:
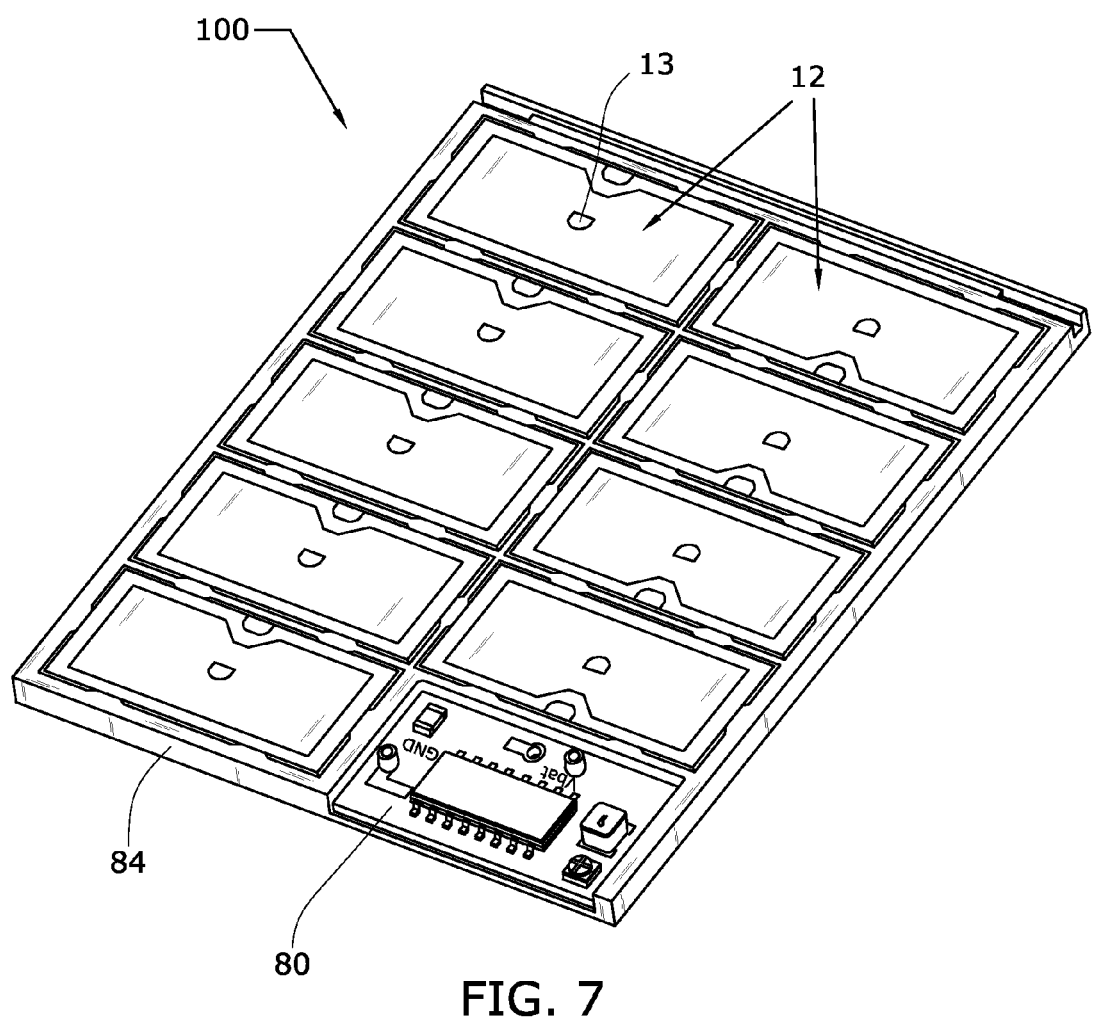
FIG. 7 is a perspective view of an alternate fuel cell assembly according to the present invention featuring an integrated circuit chip.
Figure 8:
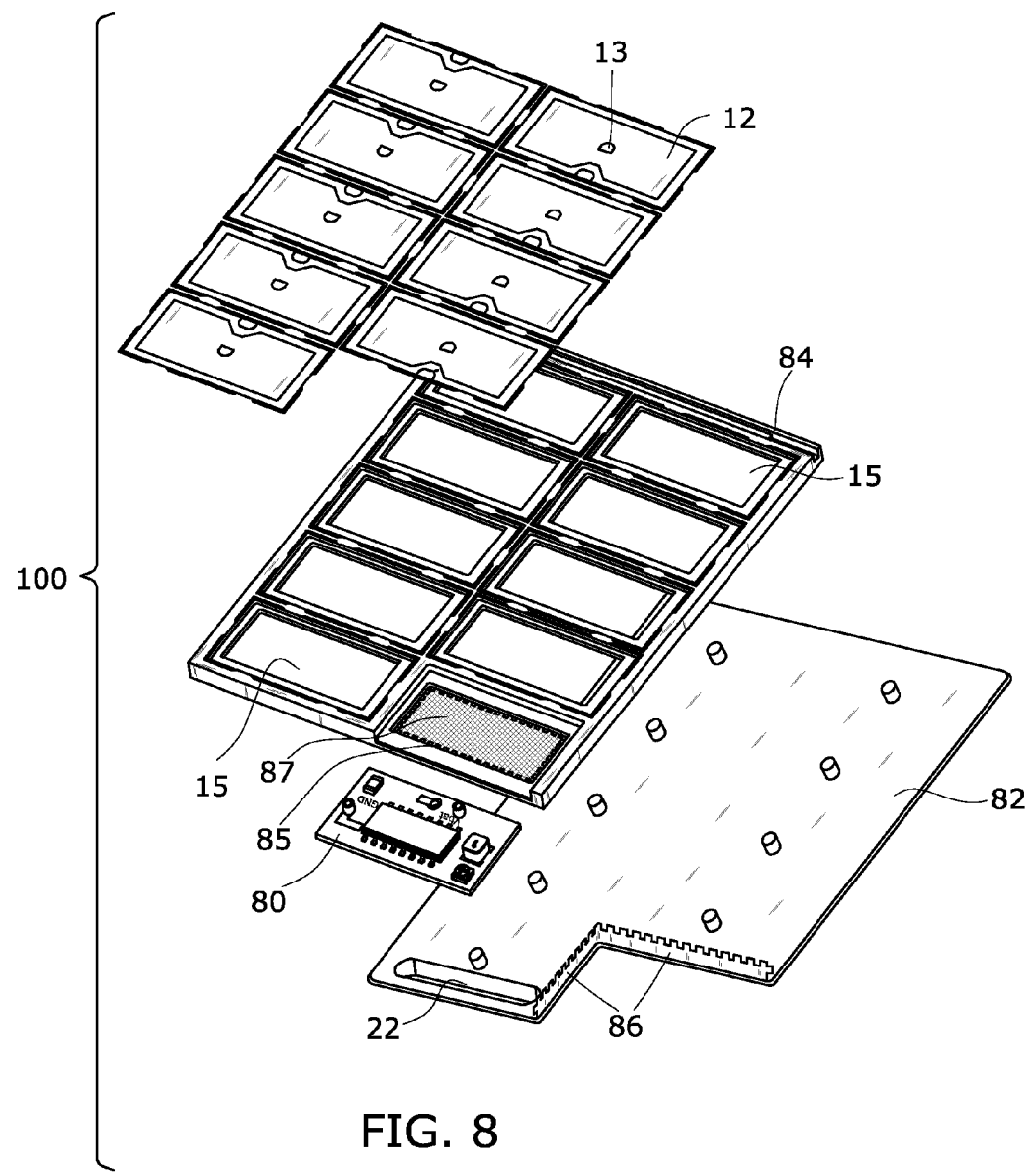
FIG. 8 is an exploded view of the fuel cell assembly of FIG. 7.
Figure 9:
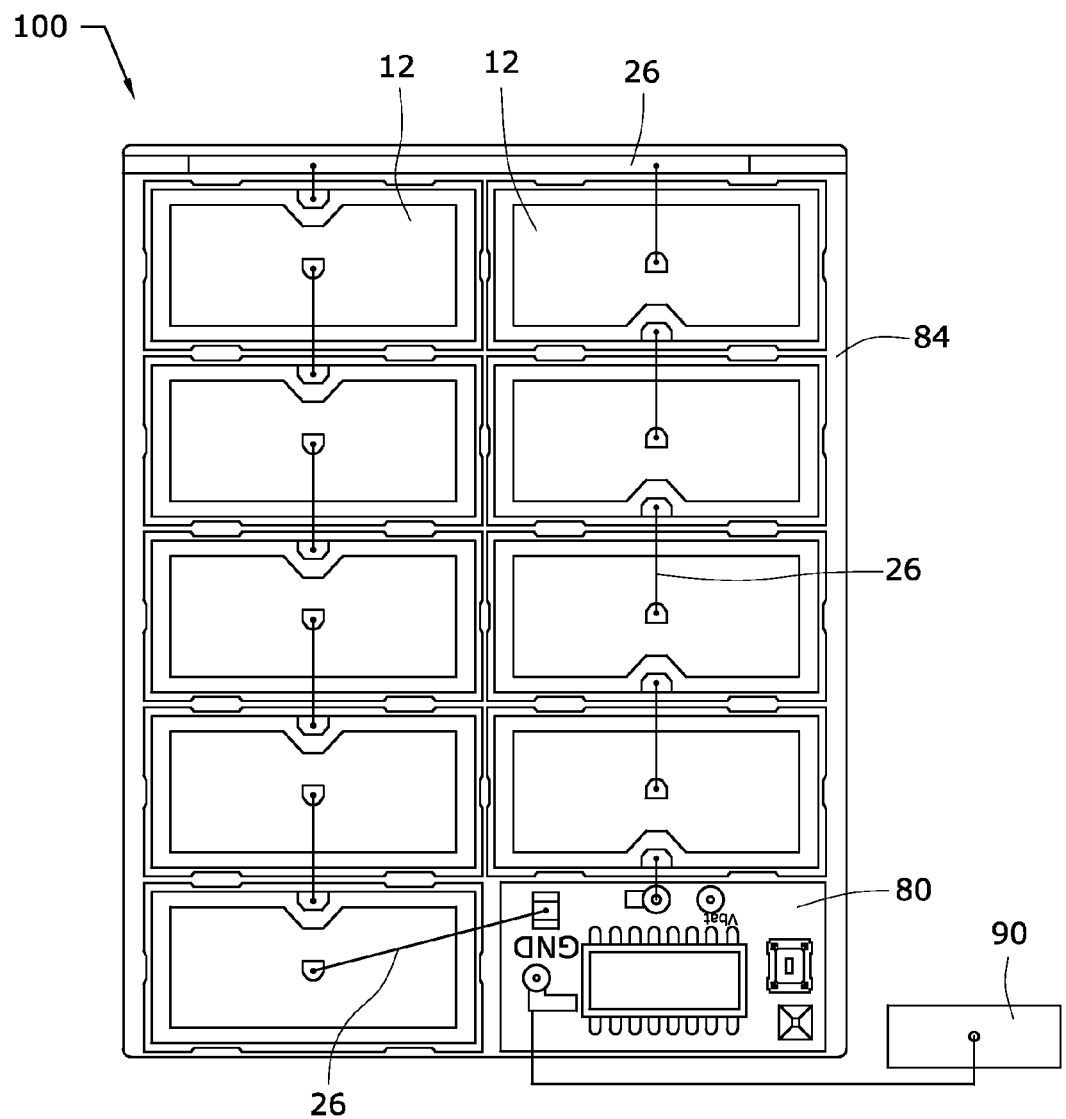
FIG. 9 is a top elevated plan view of the fuel cell assembly of FIG. 7 showing the electrical connections.

In FIGS. 7-9, an alternative embodiment of the assembly of the present invention is shown. In this embodiment, a functional element 80 is attached to assembly 10 so that assembly 10 is capable of providing electricity directly to an electronic device 90. In other words, assembly 10 and functional element 80 together act as a power module 100 for electronic device 90, which can be a cell phone, MP3 player, laptop, GPS device, etc.

Preferably, functional element 80 comprises circuitry configured to regulate the electricity produced by fuel cells 12 in assembly 10. As is known in the art, fuels cells 12 produce direct current, which is the same type of current used by many electronic devices, but the current and voltage levels produced may vary widely over time. This is due to many factors, including availability of fuel provided to fuel cells 12 and the efficiency of fuel cells 12. Furthermore, as a plurality of fuel cells 12 are provided, each fuel cell 12 may produce a different level of current and/or voltage. Even if fuel cells 12 produce a constant current and/or voltage, the electronic device may require a different level or current and/or voltage. Preferably, functional element 80 includes at least one Application Specific Integrated Circuit chip (ASIC), which may be, for example, a DC-DC converter, a voltage regulator, operational amplifier, or the like. Functional element 80 can also be configured to perform various functions, including but not limited to controlling fuel cell reaction by regulating the current in order to adjust the humidity of the fuel cell electrolyte, controlling the fuel cell system yield by increasing or decreasing the voltage of the fuel cell, or controlling the fuel cell efficiency to avoid flooding or drying as the reaction proceeds.

As shown in FIG. 9, all fuel cells 12 are connected serially to each other by connectors 26, similar to the embodiment shown in FIG. 3, and functional element 80 is electronically connected to the fuel cells to collect and transform the electricity produced by fuel cells 12 into an output suitable for electronic device 90. Electrical connectors 26 may be formed by wire bonding, spots of conductive glue, balls of low-melting metals, or by any comparable interconnect technology known to those in the art. Functional element 80 may work as a regulator, delivering the correct amount of electricity to electronic device 90 for operation, battery charging, providing protection against overloading, or any other use known in the art. The electricity provided in one embodiment is anticipated to be about 3-7 volts and about 150-250 mA, but can vary with different numbers of fuel cells 12 and types of functional elements 80.

Frame 84 may be similar to frame 14, which is pictured in FIGS. 1-5 and utilized in other embodiments of the inventive fuel cell assembly 10. However, the size and shape of the opening for functional element 80 is determined by the size and shape of the functional element 80 itself, and may or may not be the same size and shape as openings 15 for fuel cells 12, so frame 84 may provide for a different sized opening 85 for functional element 80. Fuel cells 12 and functional elements 80 can be positioned on a printed circuit board. An optional insulation layer 87 may be provided below opening 85 to prevent functional element 80 from contact with the fuel inside power module 100. Alternatively, as shown in FIG. 8, rear cover 82 may include a sealing wall 86, similar to sidewall 9 in FIG. 4, which insulates the area below functional element 80 from the free flow of fuel.

Power module 100 may be a permanent attachment to electronic device 90, with fresh supplies of fuel being provided as necessary. Alternatively, power module 100 may be disposable, or power module 100 may be attached to the fuel cartridge.

While it is apparent that the illustrative embodiments of the invention disclosed herein fulfill the objectives of the present invention, it is appreciated that numerous modifications and other embodiments may be devised by those skilled in the art. Additionally, feature(s) and/or element(s) from any embodiment may be used singly or in combination with feature(s) and/or element(s) from other embodiment(s). Therefore, it will be understood that the appended claims are intended to cover all such modifications and embodiments, which would come within the spirit and scope of the present invention. All publications discussed herein, including but not limited to patents, patent applications, articles, and books, are incorporated by reference in their entireties.

What is claimed is:

1. A fuel cell assembly comprising:
a frame having a plurality of openings formed therewithin to define an array;
at least one fuel cell having an anode side sealingly disposed within one opening;
a rear cover sealingly attached to the frame on the anode side of the at least one fuel cell;
at least one protruding support member extending from the rear cover to contact at least one fuel cell;
a fuel inlet connected to the rear cover, capable of connecting to a fuel supply; and
a chamber formed between the frame and the rear cover, wherein the chamber is capable of being in fluid connection with the fuel supply, and wherein each fuel cell is in fluid contact with the chamber, and wherein fuel disperses from the fuel supply through the chamber to feed the anode side of the at least one fuel cell.

2. The fuel cell assembly of claim 1, wherein the at least one support member comprises a post.

3. The fuel cell assembly of claim 1 comprising at least one additional fuel port.

4. The fuel cell assembly of claim 3, wherein the at least one additional fuel port is an inlet and wherein the at least one additional fuel port and the fuel inlet are arranged within the assembly to create a circular flow pattern when fuel is introduced through the plurality of fuel inlets.

5. The fuel cell assembly of claim 3, wherein the fuel inlet is disposed at a first end of the fuel cell assembly, and wherein the at least one additional fuel port is disposed at an opposing end of the fuel cell assembly.

6. The fuel cell assembly of claim 3, wherein the at least one additional fuel port is an outlet.

7. The fuel cell assembly of claim 1, further comprising at least one electrical connector, wherein the at least one electrical connector connects a first fuel cell to at least one second fuel cell.

8. The fuel cell assembly of claim 7, wherein the at least one electrical connector is disposed on a surface of the frame.

9. The fuel cell assembly of claim 7, wherein the at least one electrical connector is embedded in either the frame or the rear cover.

10. The fuel cell assembly of claim 7, wherein the first fuel cell is electrically connected in series to the at least one second fuel cell.

11. The fuel cell assembly of claim 7, wherein the first fuel cell is electrically connected in parallel to the at least one second fuel cell.

12. The fuel cell assembly of claim 7, wherein at least one electrical connector is configured to connect the at least one fuel cell to a device.

13. The fuel cell assembly of claim 9, wherein the at least one electrical connector is formed by wire bonding.

14. The fuel cell assembly of claim 9, wherein the at least one electrical connector comprises an amount of conductive adhesive.

15. The fuel cell assembly of claim 9, wherein the at least one electrical connector comprises an amount of low-melting metal.

16. The fuel cell assembly of claim 1 further comprising a heat sink.

17. A fuel cell assembly comprising:
a frame having a plurality of openings fainted therewithin to define an array;
at least two fuel cells having an anode side sealingly disposed within two openings;
a rear cover sealingly attached to the frame on the anode side of the at least two fuel cells;
a fuel inlet connected to the rear cover, connected to a fuel supply, and
a chamber formed between the frame and the rear cover, wherein the chamber is in fluid connection with the fuel supply, and wherein each fuel cell is in fluid contact with the chamber, and wherein fuel disperses from the fuel supply through the chamber to feed the anode side of the at least two fuel cells, and wherein the frame and cover are foldable along at least one axis such that the at least two fuel cells are located in at least two different planes.

18. The fuel cell assembly of claim 17, wherein the at least two fuel cells are hingedly attached to each other.

19. The fuel cell assembly of claim 17, wherein the frame and cover comprise a flexible material.

20. A power module, comprising
a plurality of fuel cells electrically connected to an electrical regulator, and at least one fuel chamber supplying fuel to the plurality of fuel cells,
wherein the electrical regulator is configured to collect electricity generated by the plurality of fuel cells and to modulate the electricity before providing the modulated electricity to at least one of a plurality of electronic devices,
wherein the plurality of fuel cells and the electrical regulator are supported by a frame having a plurality of openings formed therewithin to define an array,
wherein the array is sized and dimensioned to receive the plurality of fuel cells and the electrical regulator.

21. The power module of claim 20, wherein the electrical regulator comprises an Application Specific Integrated Circuit (ASIC) chip.

22. The power module of claim 20, wherein the plurality of electronic devices is selected from a group consisting of a battery, a phone, a laptop, an MP3 player, a GPS device, and a PDA.

23. The power module of claim 20, wherein the power module outputs a current having a voltage ranging from about 3 V to about 7 V and an amperage ranging from about 150 mA to about 250 mA.

24. The power module of claim 20, further comprising:
a rear cover sealingly attached to the frame on the anode side of the plurality of fuel cells;
a fuel inlet connected to the rear cover capable of connecting to a fuel supply containing a fuel; and
wherein the fuel chamber is formed between the frame and the rear cover, wherein the fuel chamber is capable of being in fluid connection with the fuel supply, and wherein each fuel cell is in fluid contact with the chamber, and wherein fuel disperses from the fuel supply through the chamber to feed the anode side of the plurality of fuel cells.

25. The power module of claim 20 further comprising a heat sink.

26. The power module of claim 24, wherein the fuel supply comprises a fuel cartridge.

27. The power module of claim 24, wherein the frame and cover can be adjusted along at least one axis such that at least two fuel cells can be located in at least two different planes.

28. A power module, comprising
a plurality of fuel cells electrically connected to a functional element, and at least one fuel chamber supplying fuel to the plurality of fuel cells, wherein the functional element is configured to collect electricity generated by the plurality of fuel cells and to modulate the electricity before providing the modulated electricity to at least one of a plurality of electronic devices, wherein the plurality of fuel cells and the functional element are supported by a frame having a plurality of openings formed therewithin to define an array, wherein the array is sized and dimensioned to receive the plurality of fuel cells and the functional element, and wherein the functional element is selected from a group consisting of a DC-DC converter, an operational amplifier, and a power regulator.

29. A power module, comprising a plurality of fuel cells electrically connected to a functional element, and at least one fuel chamber supplying fuel to the plurality of fuel cells, wherein the functional element is configured to collect electricity generated by the plurality of fuel cells and to modulate the electricity before providing the modulated electricity to at least one of a plurality of electronic devices, wherein the plurality of fuel cells and the functional element are supported by a printed circuit board having a plurality of openings formed therewithin to define an array, wherein the array is sized and dimensioned to receive the plurality of fuel cells and the functional element.

* * * * *